United States Patent
Lopez et al.

(10) Patent No.: US 11,225,867 B2
(45) Date of Patent: Jan. 18, 2022

(54) BREAKER AUTO-SYNCHRONIZER

(71) Applicant: ABB Schweiz AG, Baden (CH)

(72) Inventors: Camilo Lopez, Export, PA (US); Mark Foltz, Pittsburgh, PA (US); Steve Miller, Pittsburgh, PA (US); Kevin Dowdell, Pittsburgh, PA (US); Mark Wieland, Cranberry, PA (US); Alan Majors, Pittsburgh, PA (US)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 17/092,554

(22) Filed: Nov. 9, 2020

(65) Prior Publication Data
US 2021/0057917 A1 Feb. 25, 2021

Related U.S. Application Data

(63) Continuation of application No. PCT/US2019/031437, filed on May 9, 2019.

(Continued)

(51) Int. Cl.
| | |
|---|---|
| *H02J 3/40* | (2006.01) |
| *H02J 3/38* | (2006.01) |
| *F01C 20/28* | (2006.01) |
| *G01P 21/02* | (2006.01) |
| *G01R 31/28* | (2006.01) |
| *F01D 17/06* | (2006.01) |
| *F02C 9/28* | (2006.01) |
| *F01D 21/02* | (2006.01) |

(52) U.S. Cl.
CPC .............. *F01C 20/28* (2013.01); *F01D 17/06* (2013.01); *F01D 21/02* (2013.01); *F02C 9/28* (2013.01); *G01P 21/02* (2013.01); *G01R 31/2829* (2013.01); *H02J 3/381* (2013.01); *H02J 3/40* (2013.01); *F05D 2220/31* (2013.01); *F05D 2260/80* (2013.01); *F05D 2270/02* (2013.01); *F05D 2270/021* (2013.01); *F05D 2270/80* (2013.01)

(58) Field of Classification Search
CPC .. F01C 20/28; F02C 9/28; F02C 9/263; F02C 9/52; F02C 9/54; F02C 7/232; H02J 3/381; H02J 3/40; G01P 21/02; G01R 31/2829; F01D 17/145; F01D 17/26; F01D 17/06; F01D 21/02; F05D 2270/64; F05D 2220/31; F05D 2260/80; F05D 2270/02; F05D 2270/021; F05D 2270/80
See application file for complete search history.

(56) References Cited

U.S. PATENT DOCUMENTS

| | | | |
|---|---|---|---|
| 6,292,717 B1 * | 9/2001 | Alexander | G01R 19/2513 340/6.1 |
| 8,174,268 B2 * | 5/2012 | Bose | G01R 31/3274 324/418 |
| 9,438,026 B2 * | 9/2016 | Franks | H02H 3/10 |

OTHER PUBLICATIONS

Search Report and Written Opinion, PCT Appln. No. PCT/US19/31437, 6 pgs, dated Jul. 25, 2019.

* cited by examiner

*Primary Examiner* — Toan T Vu
(74) *Attorney, Agent, or Firm* — Leydig, Voit & Mayer, Ltd.

(57) ABSTRACT

A breaker between two electrical circuits is provided that is closed when electrical properties in both of the electrical circuits are matching. Two check circuits are provided for comparing electrical properties of the two electrical circuits. Each of the check circuits sets a corresponding authorization to close the breaker. The breaker is only closed if both check circuits set an authorization to close the circuit.

20 Claims, 20 Drawing Sheets

Related U.S. Application Data

(60) Provisional application No. 62/669,042, filed on May 9, 2018, provisional application No. 62/669,048, filed on May 9, 2018, provisional application No. 62/669,070, filed on May 9, 2018, provisional application No. 62/669,063, filed on May 9, 2018, provisional application No. 62/669,057, filed on May 9, 2018.

BREAKER AUTO-SYNCHRONIZER

BACKGROUND

The present inventions relate generally to breakers, and more particularly, to synchronizing a breaker between an electrical generator and a power grid.

Electrical power plants are connected to a power grid with a main breaker. Many electrical power plants employ large steam turbines to generate electricity. If the breaker is closed when the voltage and frequency of the power plant and grid do not match, serious equipment damage can occur and potential physical harm can occur to people located nearby. For example, if the voltage and frequency of the power plant and grid are mismatched when the breaker is closed, the breaker will typically reopen immediately to disconnect the power plant from the grid. However, such reopening of the circuit breaker can occur in a violent reaction or in an explosion-like event. If the circuit breaker does not reopen in such an event, the mismatch in voltage and/or frequency can cause the generator to quickly accelerate to match the grid, and such a quick acceleration of the generator and connected hardware (e.g., the turbine) can cause damage or a sudden failure of the equipment.

SUMMARY

A system is described for connecting two electrical circuits together while ensuring that an electrical property in each of the circuits is matching. The system includes two check circuits that must both set authorizations to close a breaker. The first electrical circuit may be an electrical grid and the second electrical circuit may be an electrical generator. The electrical properties may be a voltage and a frequency of each of the electrical circuits.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
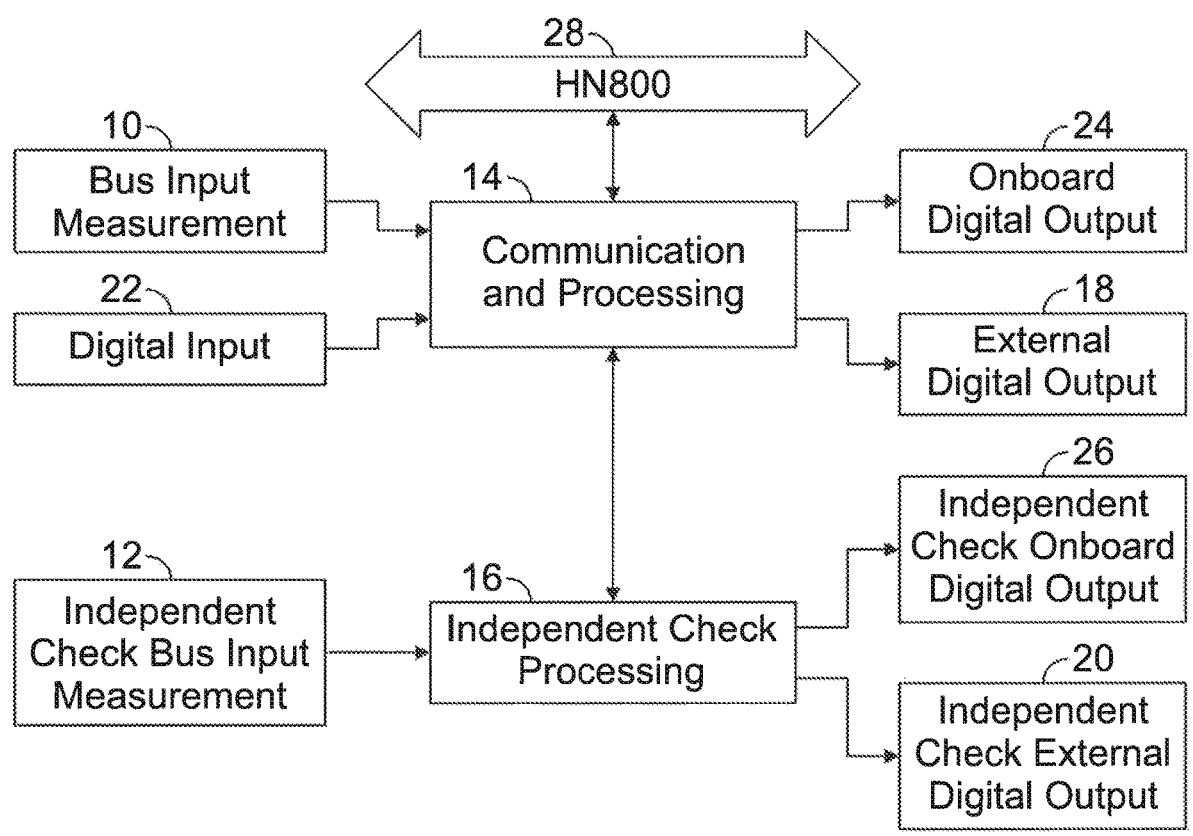
FIG. 1 is a block diagram of two separate circuits 10, 14, 18 and 12, 16, 20 for controlling the closing of a breaker 102 between two electrical circuits 98, 100.
Figure 2:
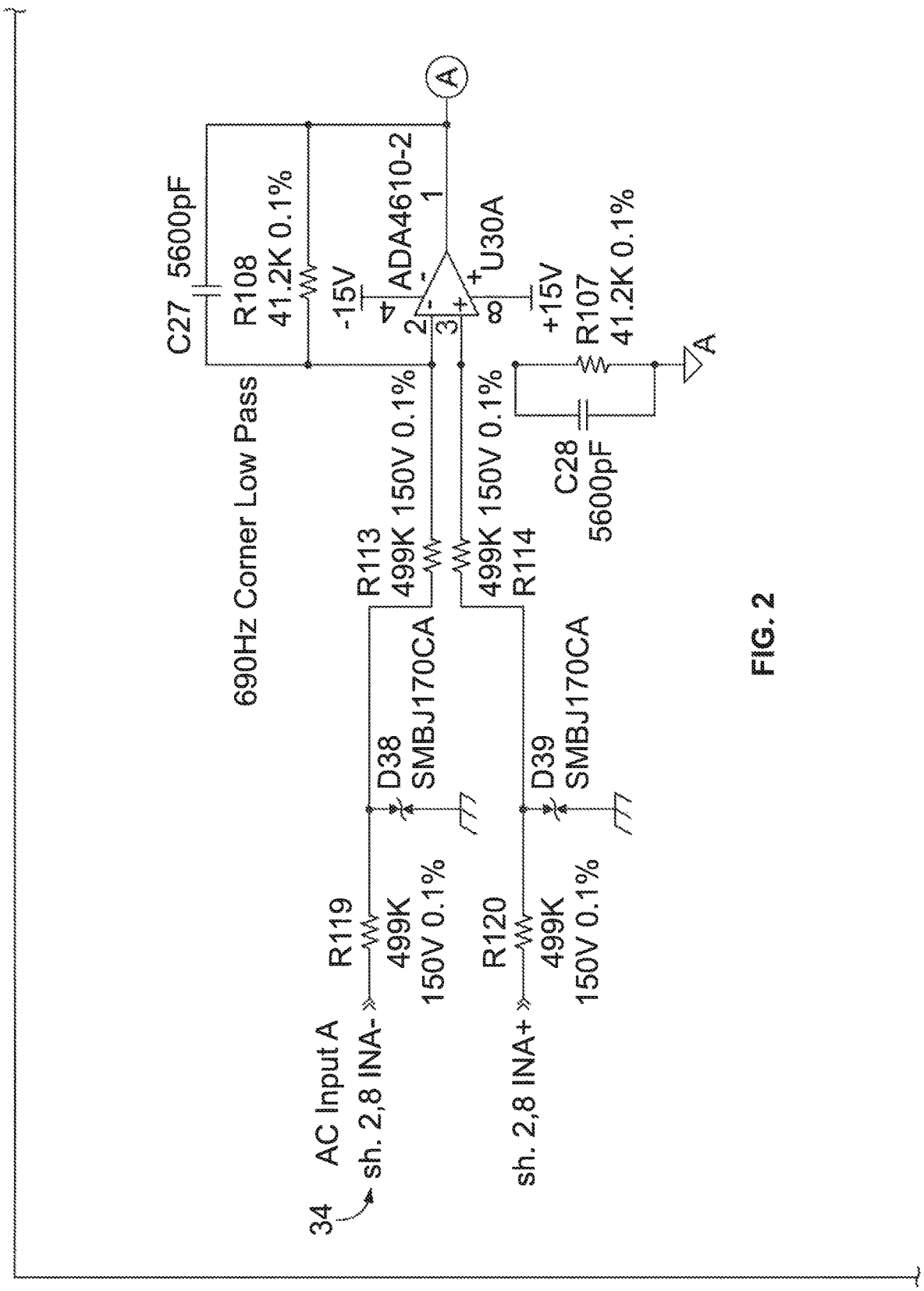
FIG. 2 includes schematics of two derivation circuits 30, 32 for converting the electrical waveform 34 of the first electrical circuit 98 into an average voltage 38 and frequency phase signal 40 and for converting the electrical waveform 36 of the first electrical circuit 100 into an average voltage 42 and frequency phase signal 44.
Figure 2:
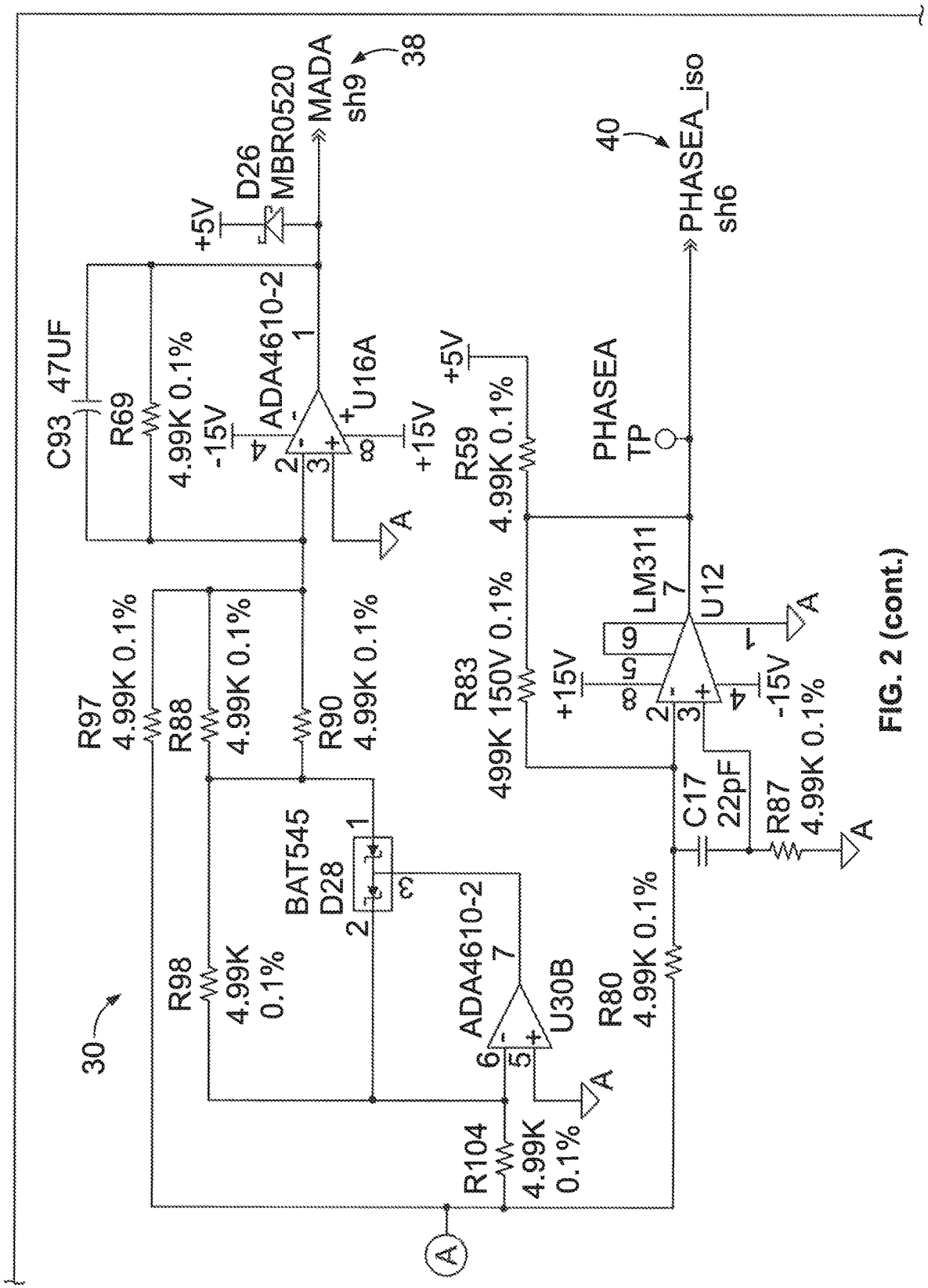
Figure 2:
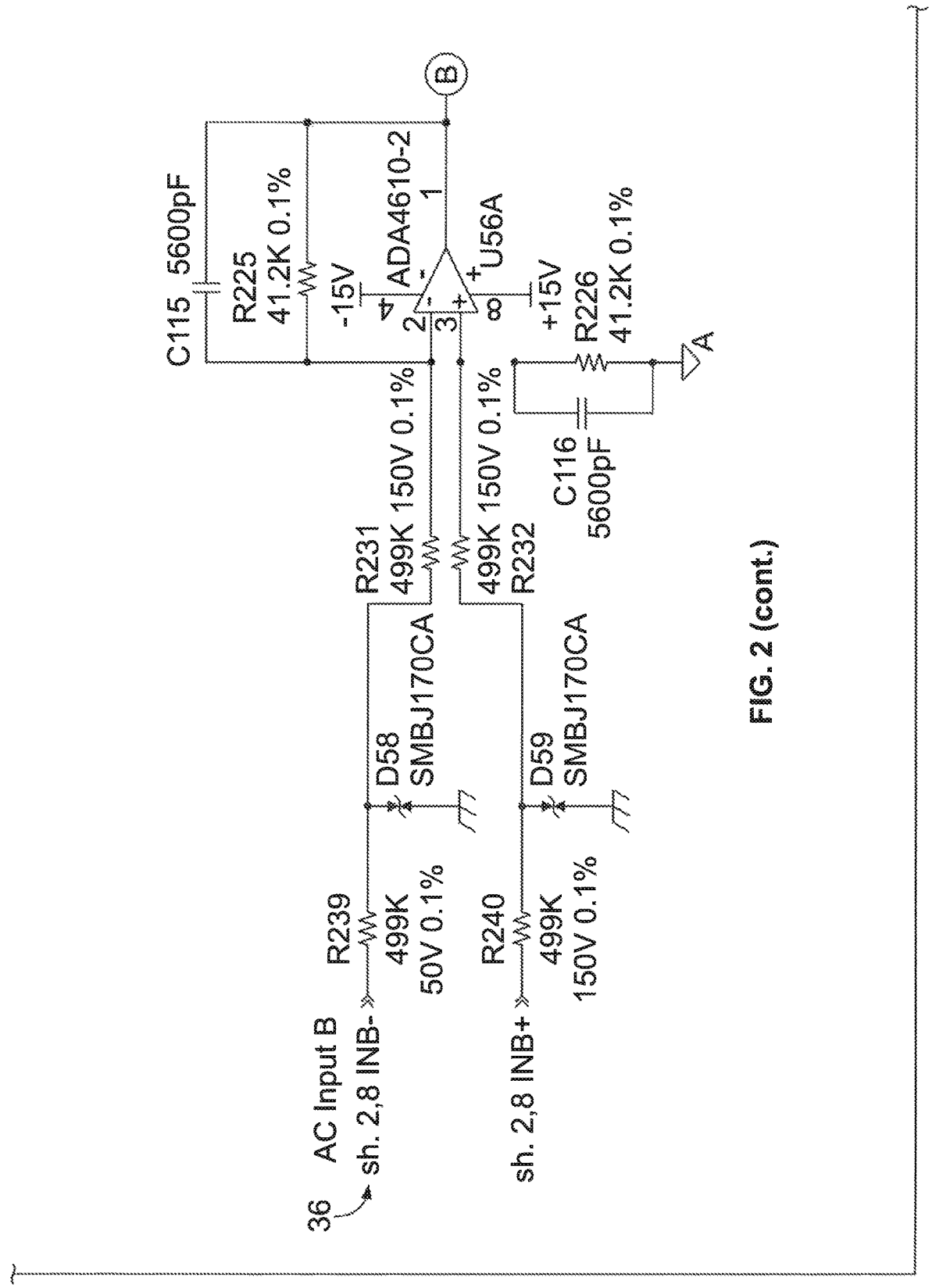
Figure 2:
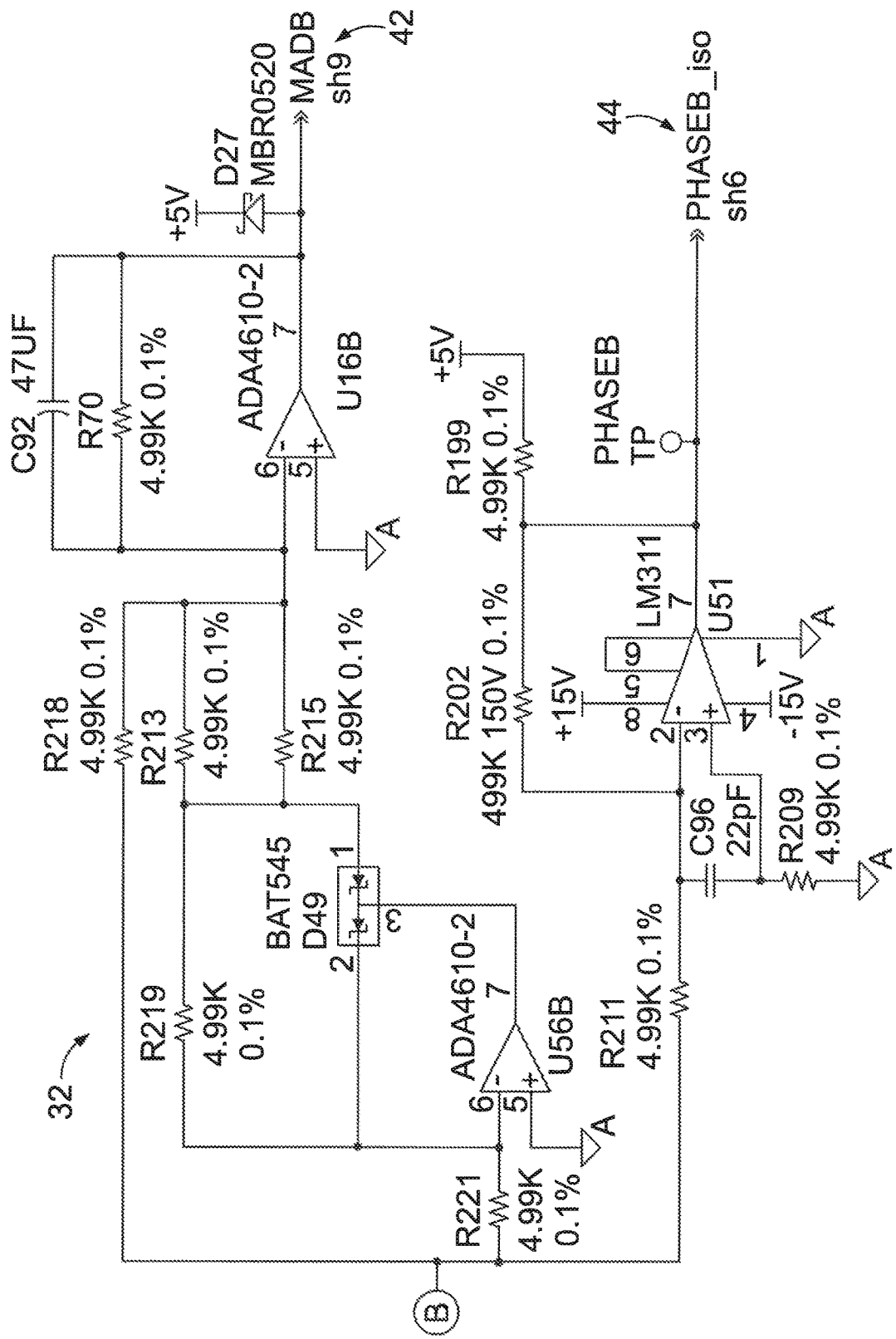
Figure 3:
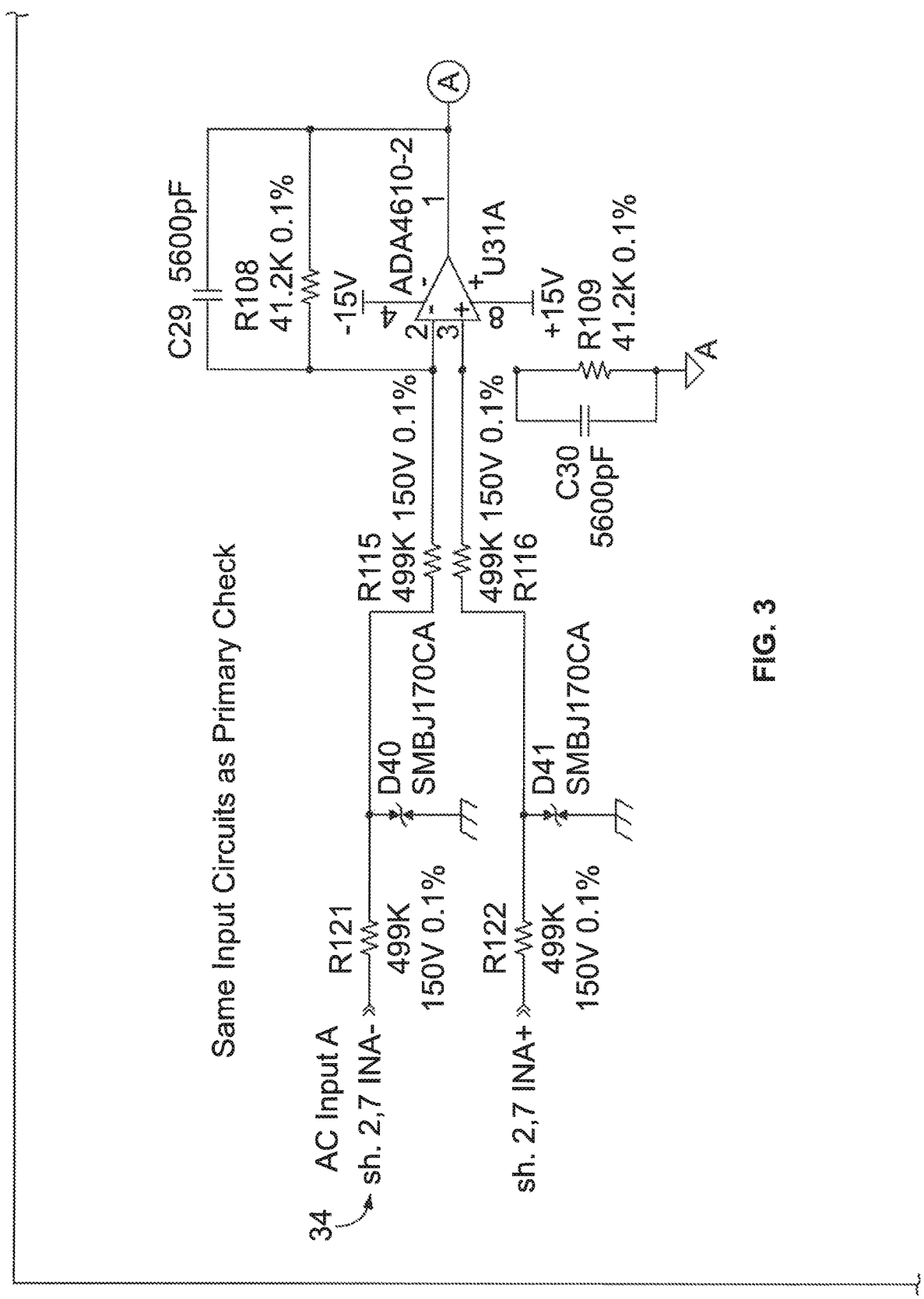
FIG. 3 includes schematics of two derivation circuits 46, 48 for converting the electrical waveform 34 of the first electrical circuit 98 into an average voltage 50 and frequency phase signal 52 and for converting the electrical waveform 36 of the first electrical circuit 100 into an average voltage 54 and frequency phase signal 56.
Figure 3:
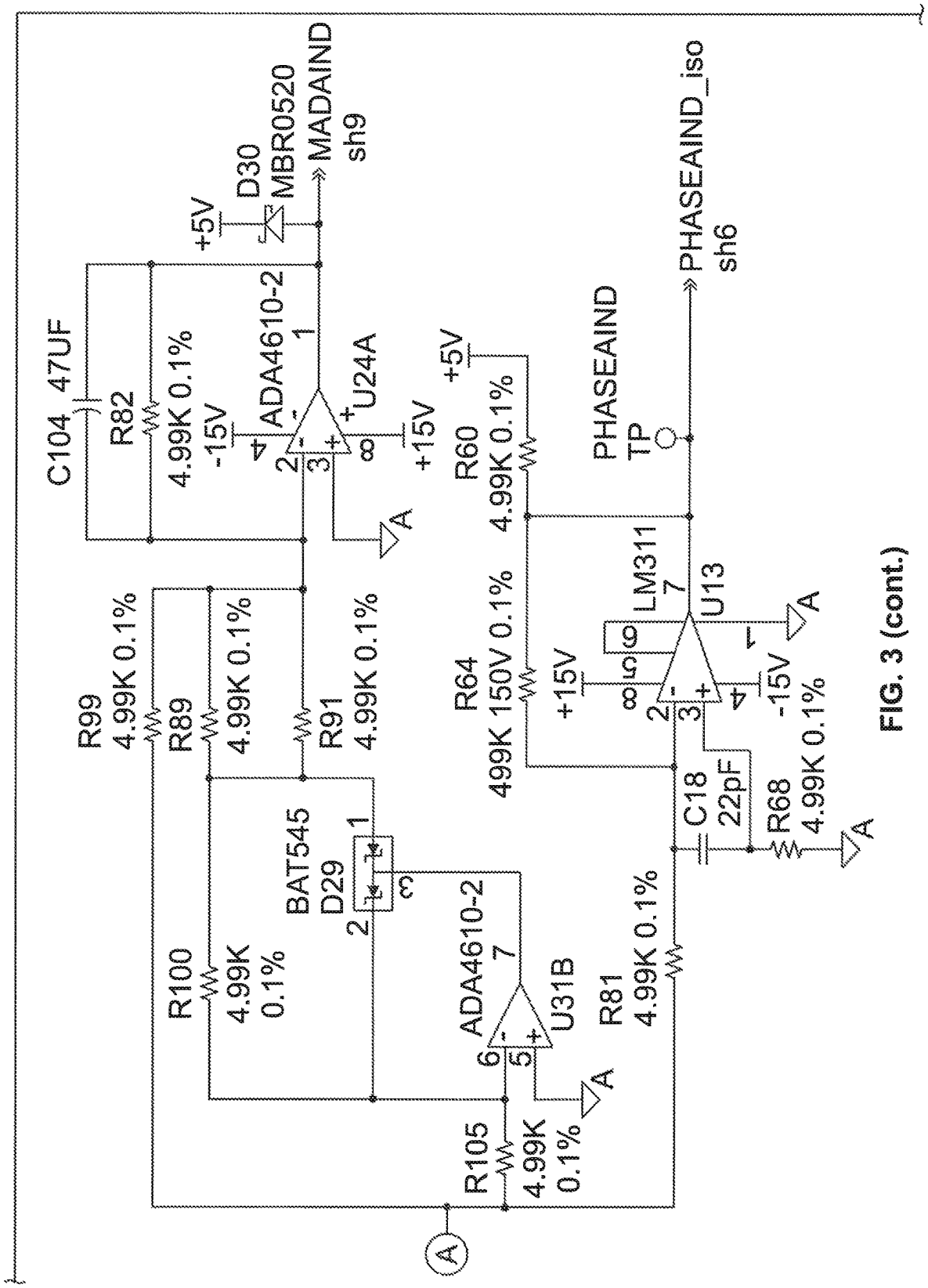
Figure 3:
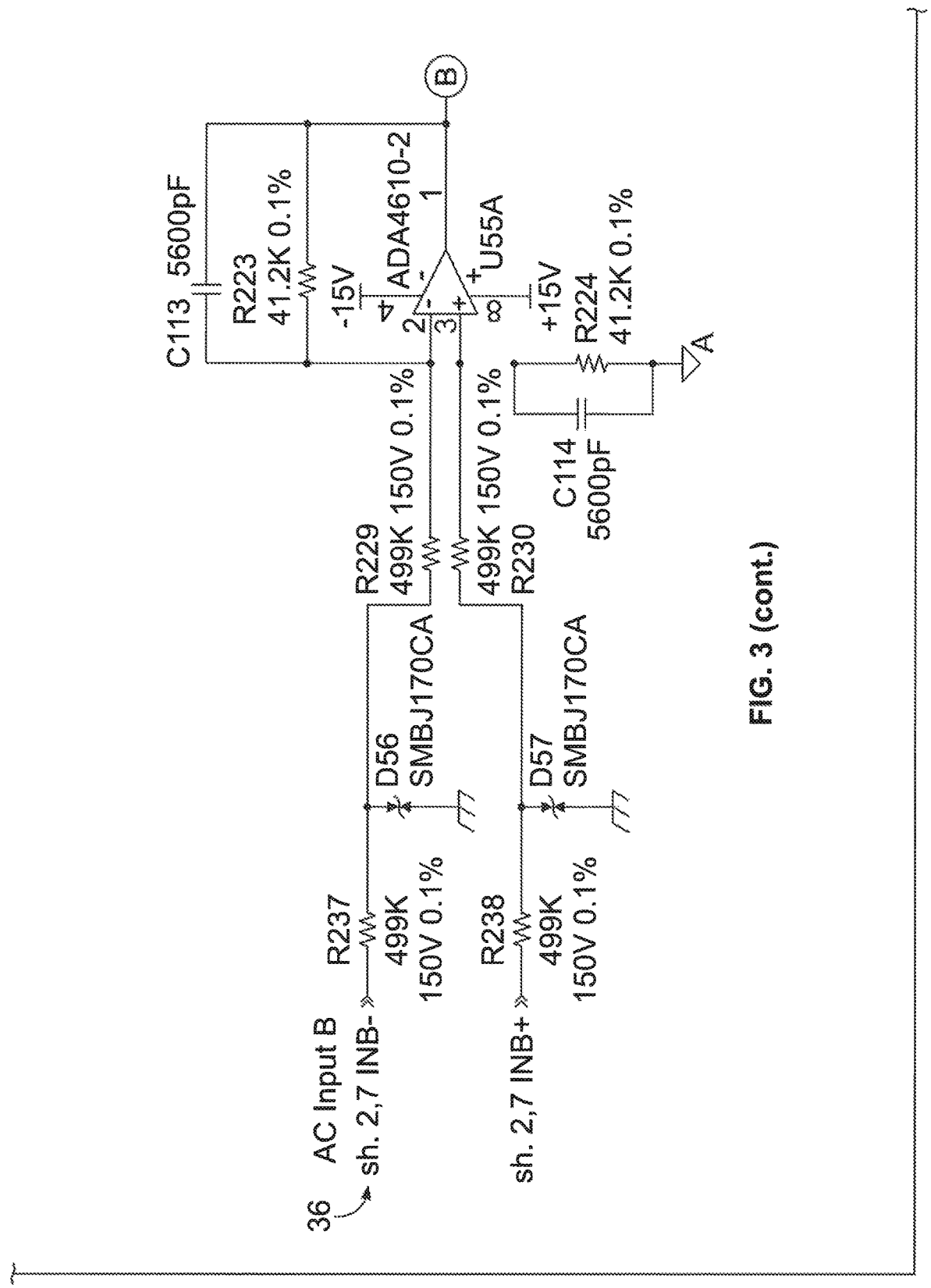
Figure 3:
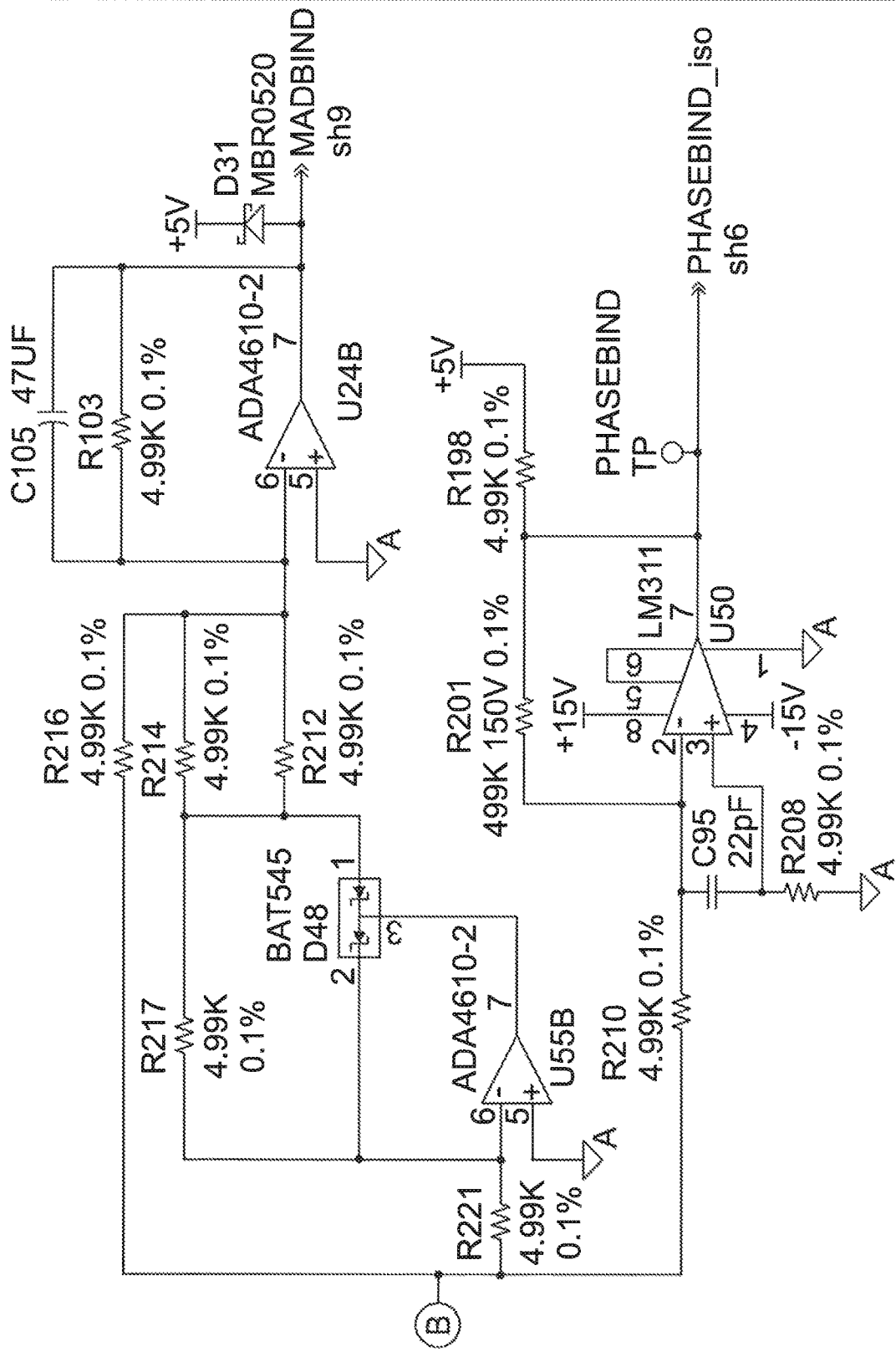
Figure 4:
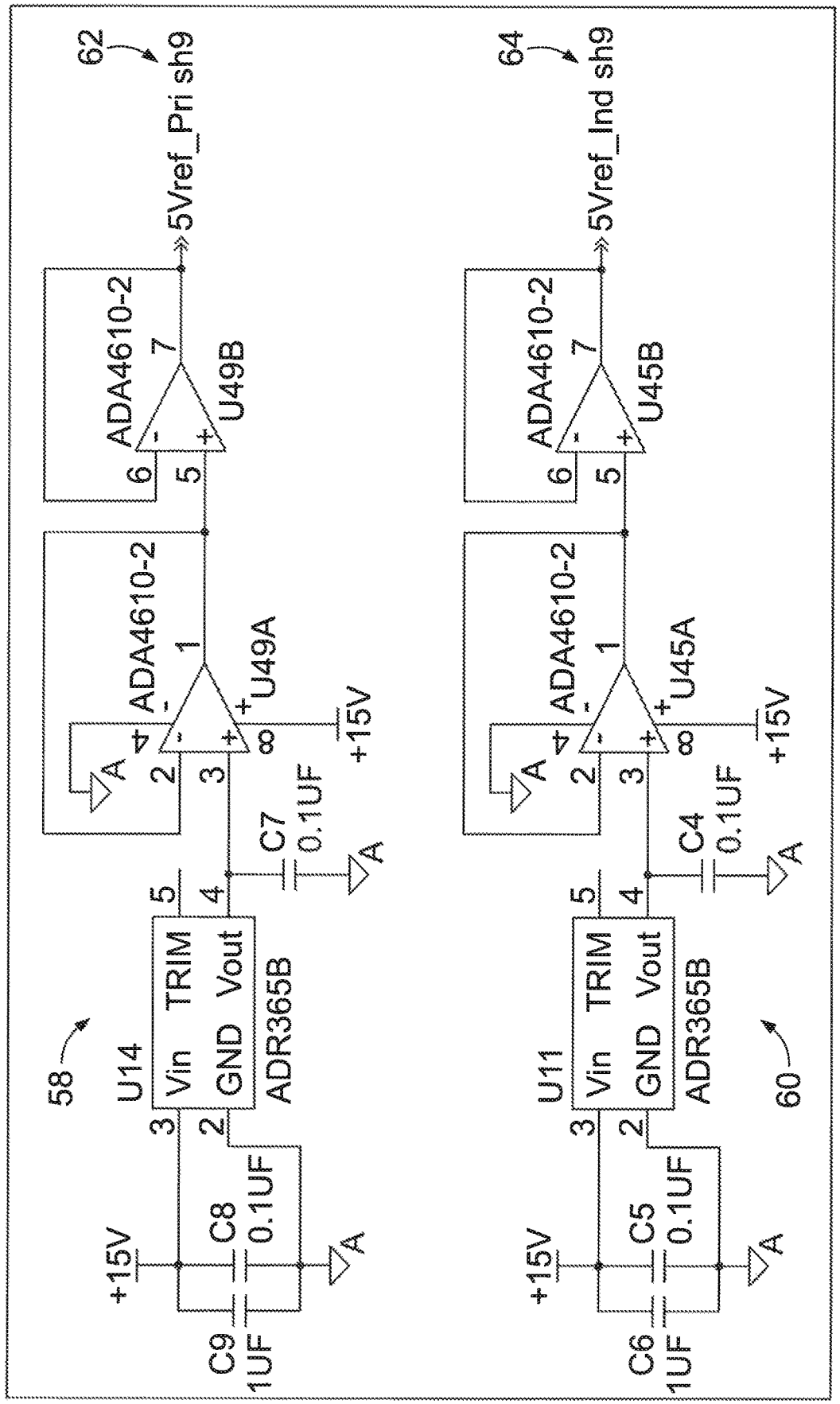
FIG. 4 includes schematics of two voltage circuits 58, 60 for generating reference voltages 62, 64 for use in the A/D circuits 66, 68.
Figure 5:
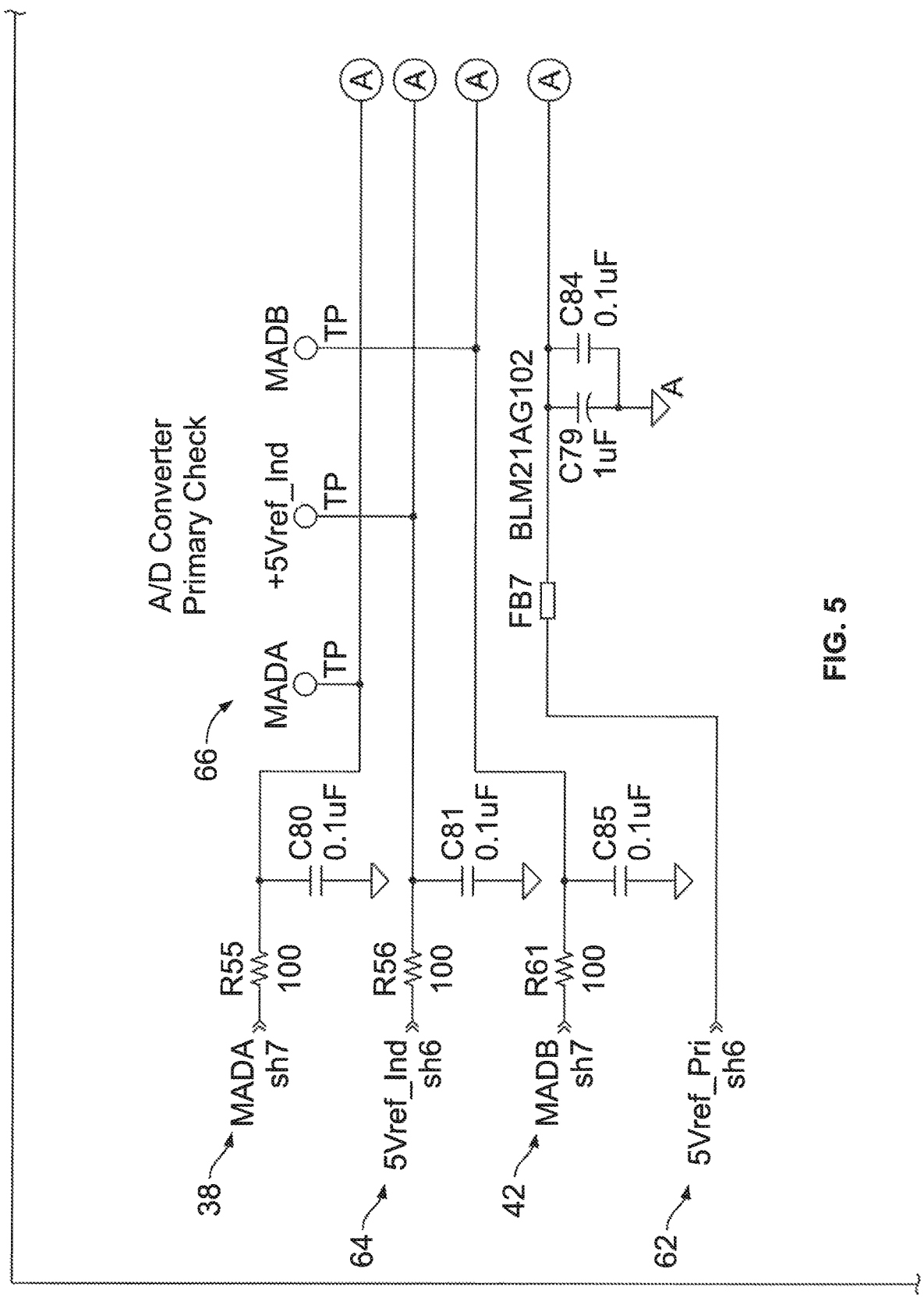
FIG. 5 includes A/D circuits 66, 68 for the average voltages 38, 42, 50, 54 to digital voltage signals 70, 72 for use by the first and second processors 74, 76, respectively.
Figure 5:
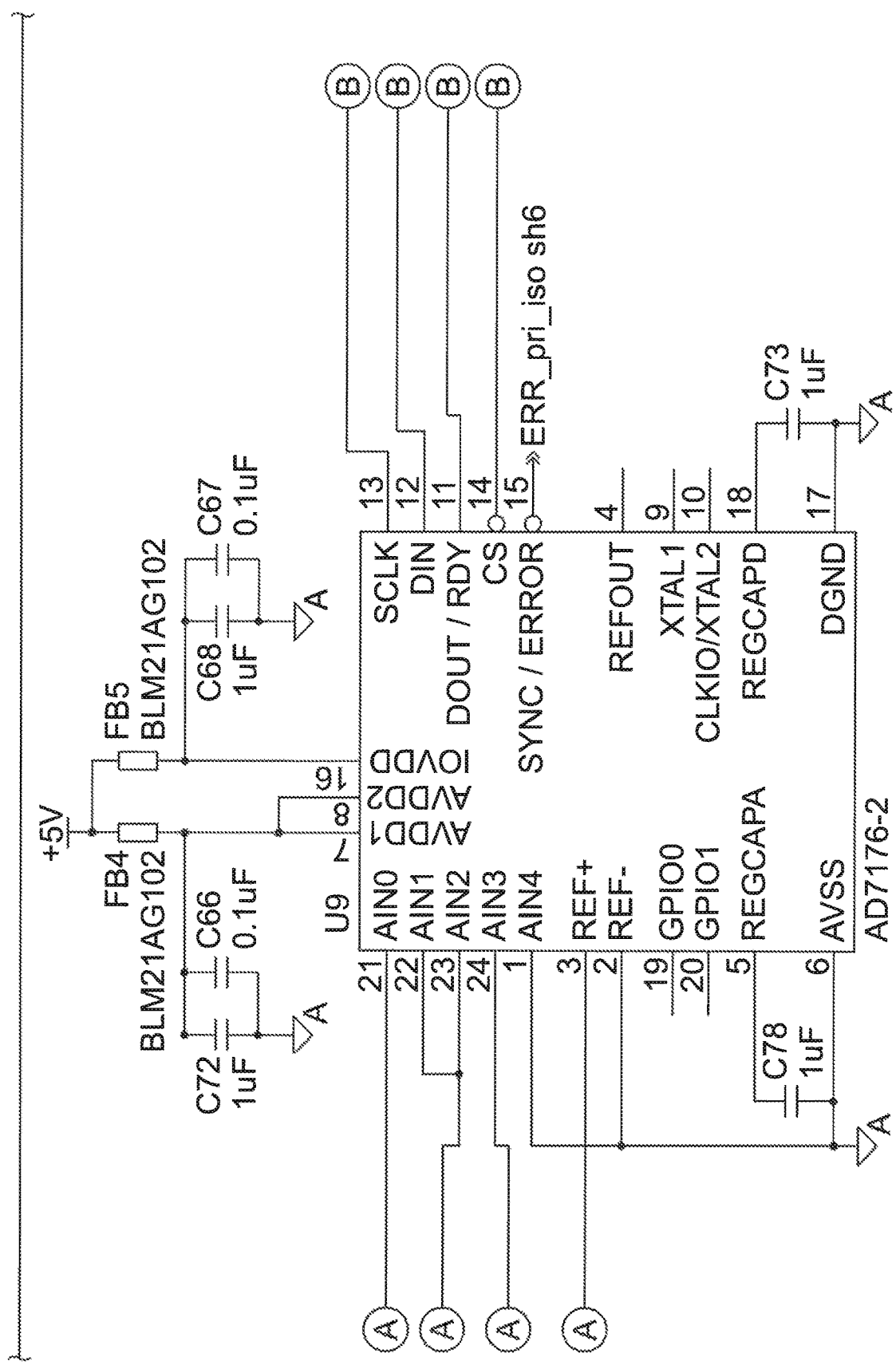
Figure 5:
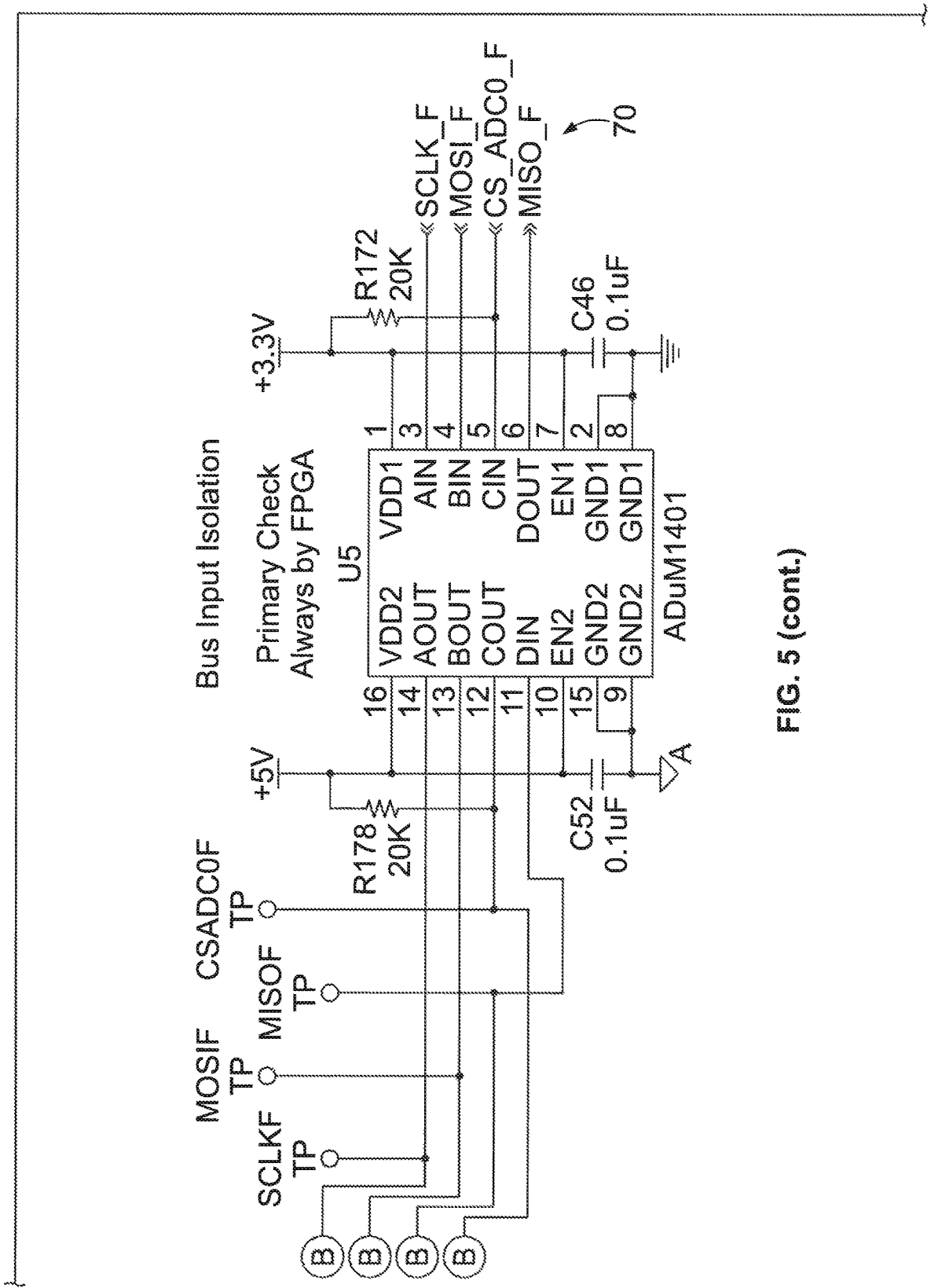
Figure 5:
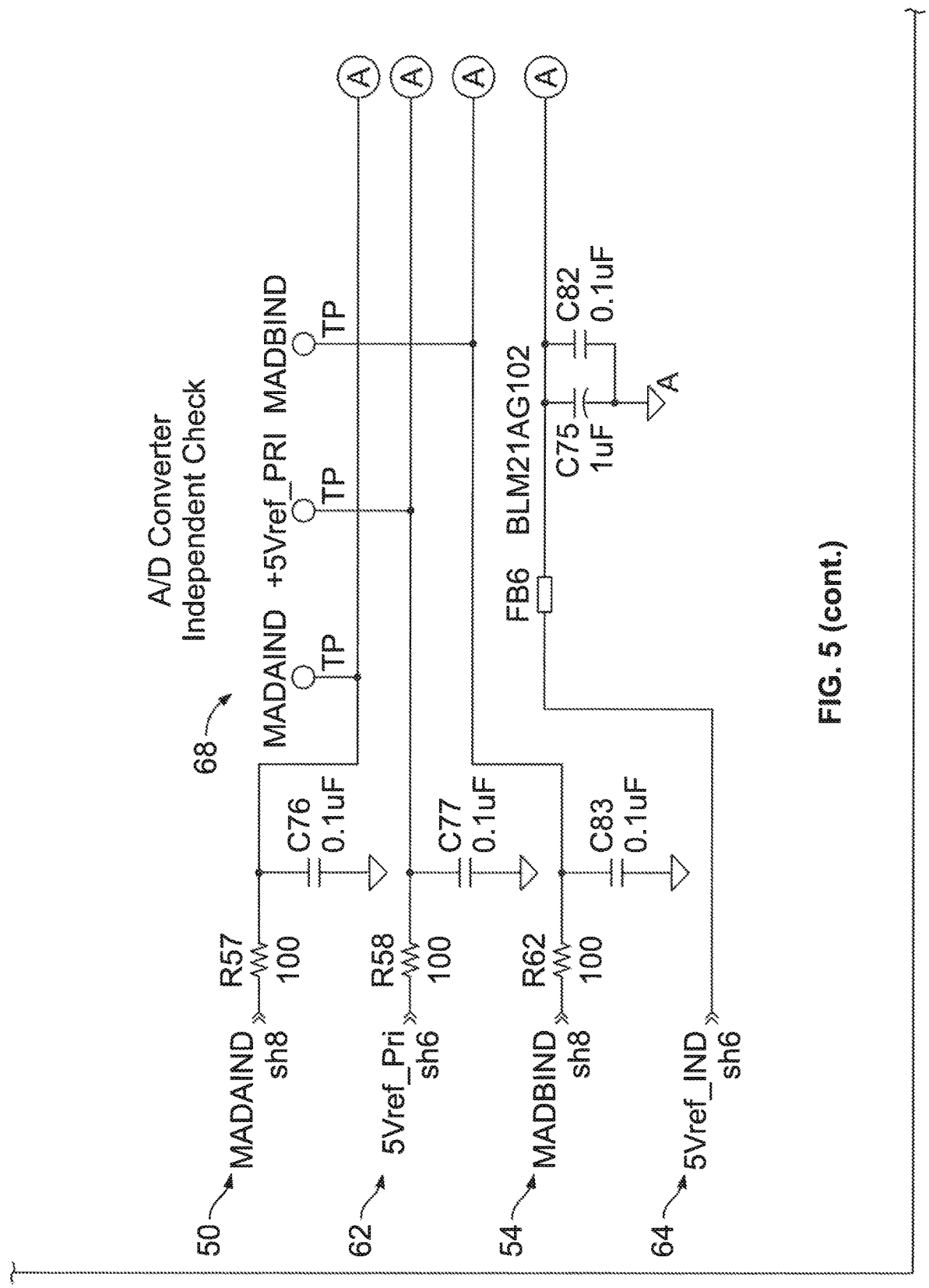
Figure 5:
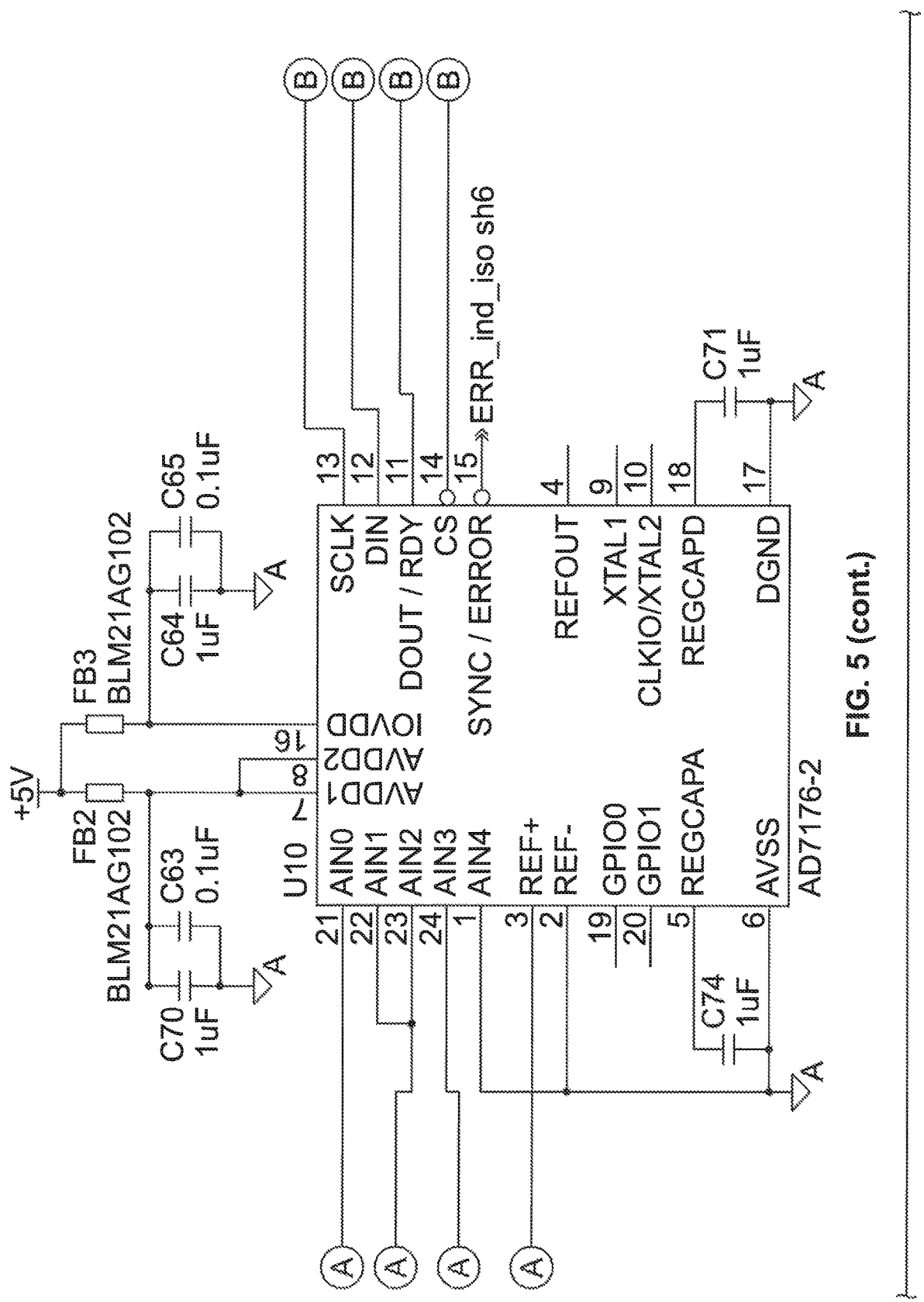
Figure 5:
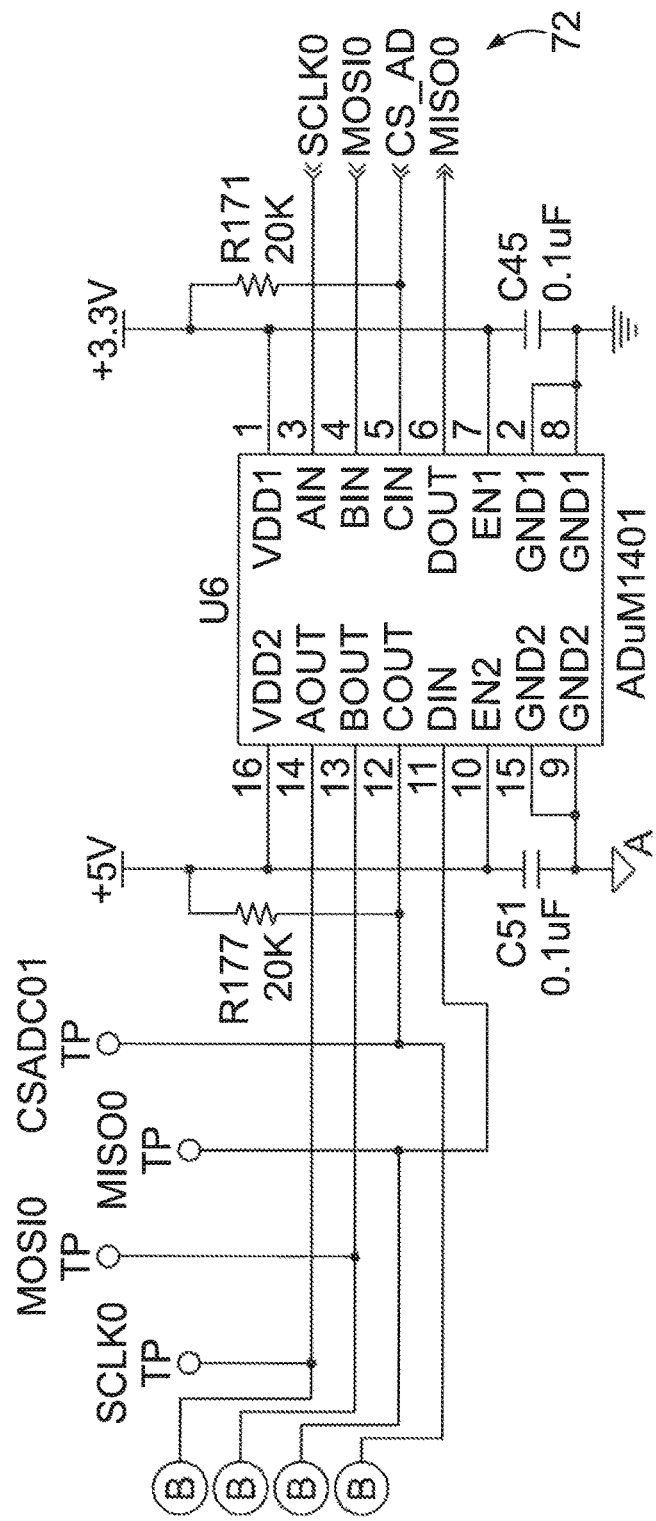
Figure 6:
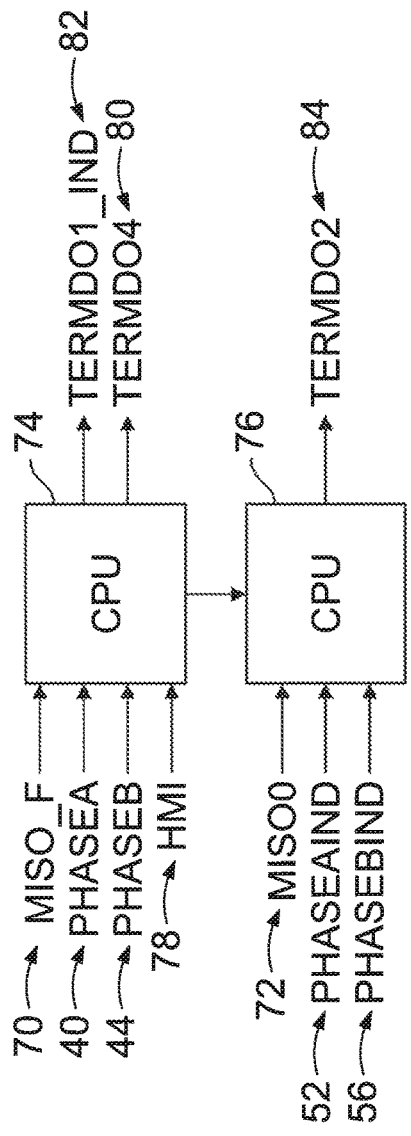
FIG. 6 is a schematic of the first and second processors 74, 76 with respective inputs and outputs.
Figure 7:
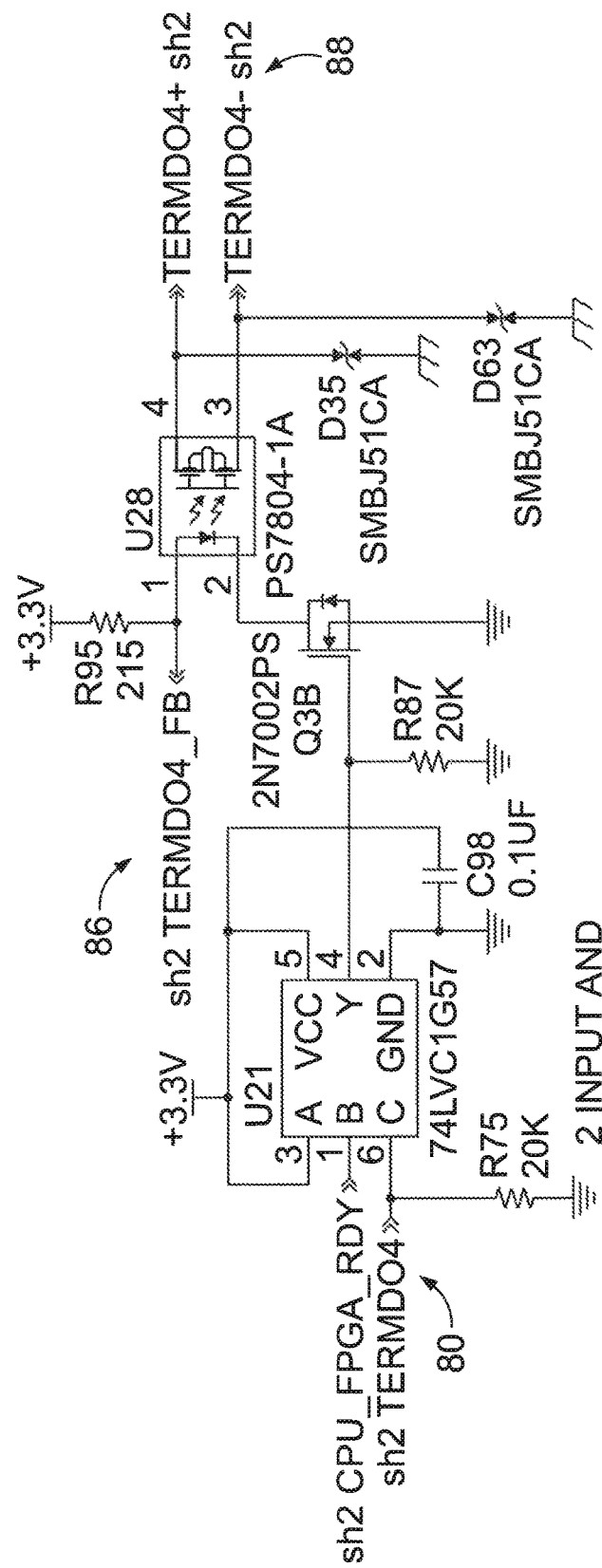
FIG. 7 is a schematic of a drive circuit 86 that uses an output 80 from the first processor 74 to send a signal 88 to the second electrical circuit 100 to make a change to match an electrical property (e.g., voltage or frequency by adjusting speed, etc.) to the first electrical circuit 98.
Figure 8:
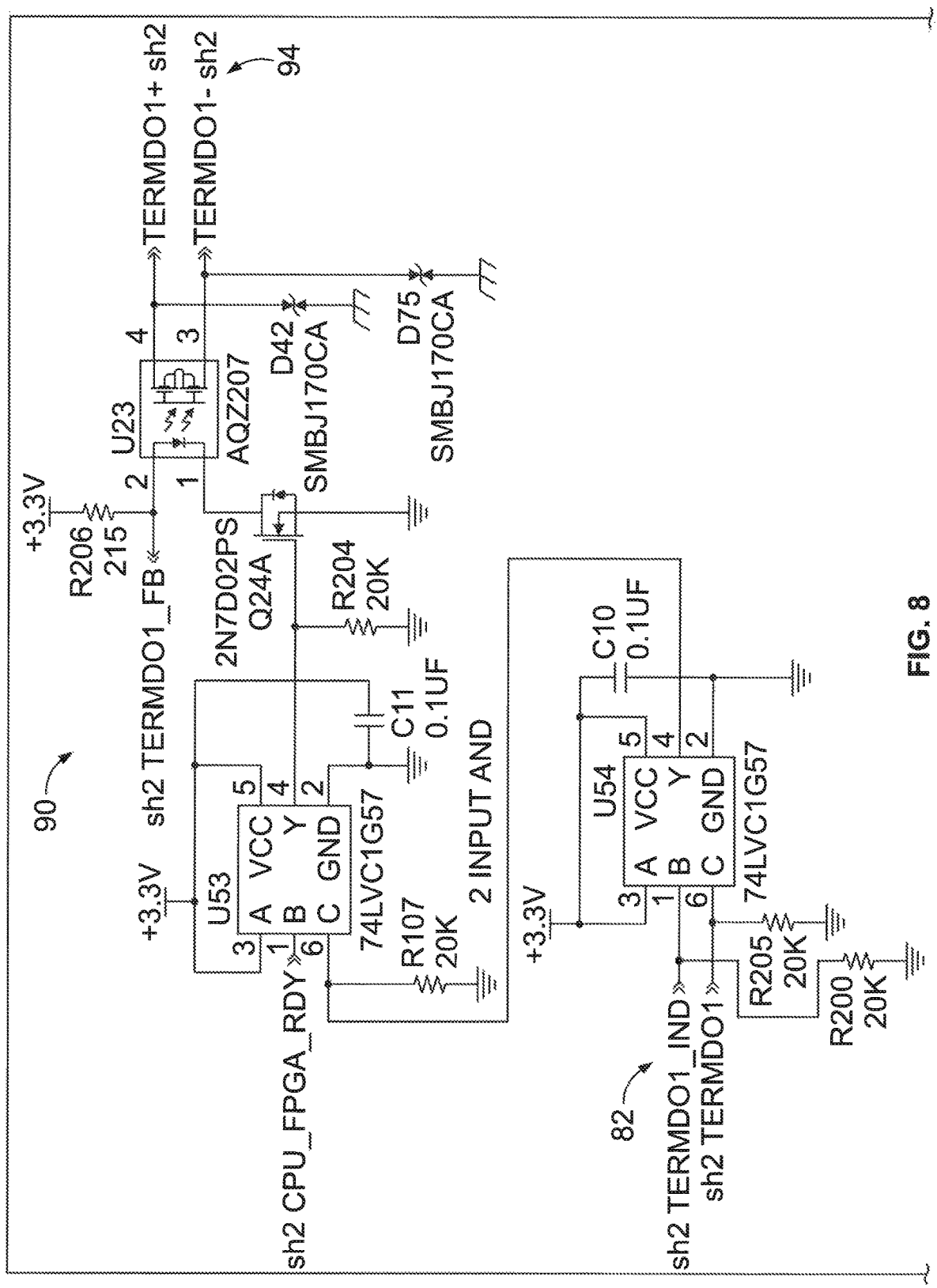
FIG. 8 includes schematics of two drive circuits 90, 92 that use outputs 82, 84 from the first and second processors 74, 76 to send signals 94, 96 to relays to open/close the relays 104, 106.
Figure 8:
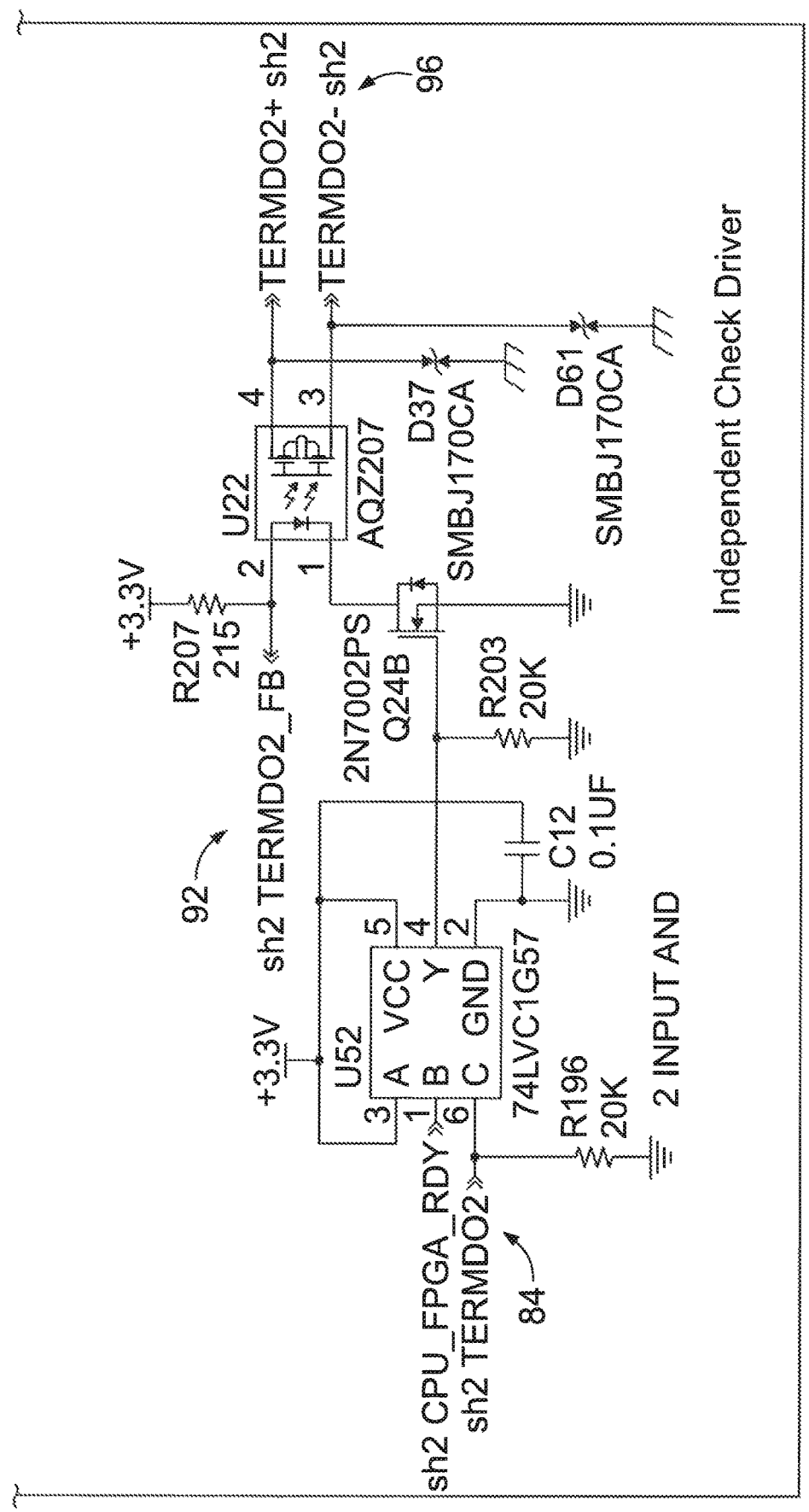
Figure 9:
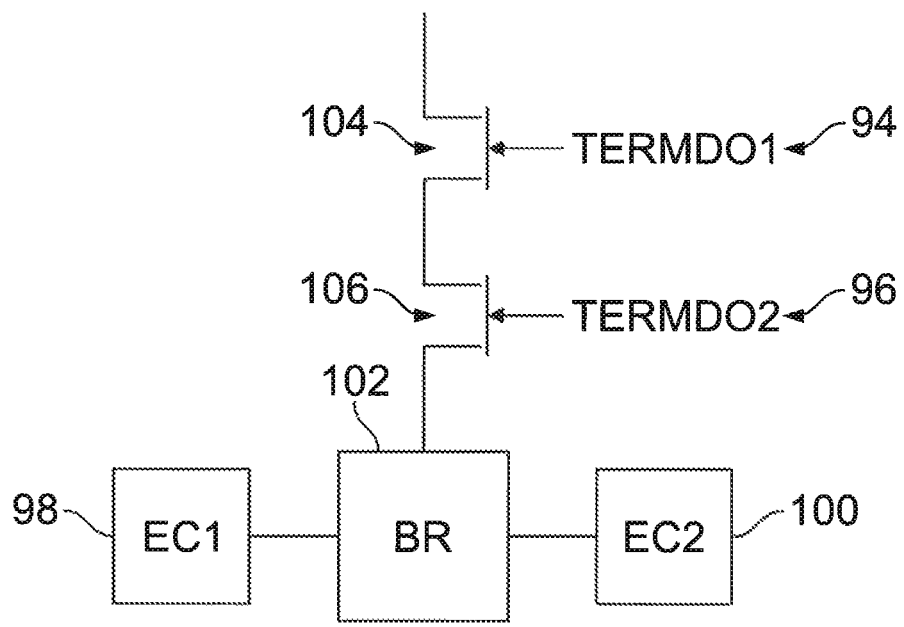
FIG. 9 is a schematic of the breaker 102 located between two electrical circuits 98, 100 and relays 104, 106 wired in series that close the breaker 102 when both relays 104, 106 are closed.

A purpose of the auto-synchronizer is to close a breaker between an electrical generator and a power grid given the voltage and frequency of both systems. Once the generator voltage and frequency closely match the grid and the phase between the two grids line up, the module initiates a breaker closure command. There is a risk that if the breaker closure command occurs when these parameters do not match serious damage to the equipment could occur and a potentially dangerous situation may exist for people in the proximity of the equipment. Frequently, an external "Sync-Check" relay is installed to prevent this from occurring. The preferred embodiments provide a built-in, redundant electrical circuit to reduce risk in the event of a component failure. The redundant circuit provides equivalent functionality to the primary synchronization circuit, but the design is different by being implemented in an FPGA and makes use of different firmware which is written in a different programming language. The diversity behind the design of the built-in Sync Check function eliminates the potential of common design flaws. The sync-check circuit acts like a permissive that will prevent the breaker closure if the two circuits do not agree that the proper condition exists to close the breaker.

The preferred embodiments provide two separate logic paths, isolated measurement and output sections, independent check measurement and output sections, communication and processing sections, and independent check processing section. For safety, each bus input attaches to two identical, independent analog circuits, each ending in an independent ADC. The ADCs attach to separate processors, running independent algorithms for detecting frequency, phase, and voltage match between the busses. For safety, DO1 is driven from an independent physical and logical source than DO2. The AS01 is equipped with an additional processor with the responsibility of independently monitoring the bus inputs and indicating if it is safe to close the breaker (based on configuration). This processor receives input from separate analog circuits and ADCs and issues an independent digital output signal. The main breaker control function of the AS01 monitors the state of the digital output controlled by the independent synchronization check function and does not initiate breaker closure, even when it determines that the conditions have been met to close the breaker, if the independent check digital output is not active.

The preferred embodiments use two separate (independent) input circuits. Two independent and different processors exist. In the preferred embodiments, the microprocessor (MCF54415) and an FPGA are the two processors. This eliminates common anomalies with the processors. Two independent and different firmware code is used to eliminate common bugs in the software. The preferred embodiments use both C code and VHDL code. Each firmware interfaces with each other to confirm agreement of the existing condition and course of action. If the two implementations disagree, each processor disables the breaker closure until the condition is corrected. Two separate (independent) output circuits are used such that they both must agree before activating a break closure. Some type of external enabling action is required, either by a human or controller logic.

FIG. 1 shows an illustration of two separate logic paths with communication therebetween for diagnostics.

The preferred embodiments provide two separate circuits independent of each other with separate input and output sources. Additionally, each circuit validates the other circuit.

FIGS. 2-9 show two separate circuits. Preferably, one circuit uses a microprocessor for control operations, and the other circuit preferably uses an FPGA for control operations. Thus, the two circuits will be immune to design faults that could otherwise affect all circuits of a matching design.

An improvement of the preferred embodiments is the full and diverse redundancy and the inter communication between the two implementations. In some prior systems, either a single circuit or duplicate circuits with similar logic existed to initiate a breaker closure. The preferred embodiments provide different circuit designs, different processors (e.g., microprocessor vs. FPGA) and different programming code and language to provide full and diverse redundancy. Other prior methods may have included redundant but similar circuits that may have had common flaws or could have failed under similar conditions.

The principal application of the preferred embodiments is in electrical generating power plants that have a main breaker between the electrical generator and a power grid. This application is referred to as line-generator mode. However, there are other applications for switch-yard use, peer-to-peer bus connection and dead-bus applications. The preferred embodiments also cover the same or similar redundancy and protection methods for these other applications.

An improvement of the preferred embodiments is preventing a single component failure (or failure of several components in similar redundant circuits) from inadvertently closing a generator breaker when the two buses do not match in voltage, frequency and phase which may have the potential of causing serious equipment damage and consequently creating a dangerous situation. Additionally, the logic informs the operator that a mismatch or failure exists, so the issue can be resolved in a timely manner.

An advantage of the preferred embodiments is reducing the risk of untimely breaker closure. Another advantage is informing the user that a component failure may exist. Another advantage is reducing the risk of equipment damage. Another advantage is reducing the risk of injury to personnel.

An improvement of the preferred embodiments is providing separate and different electrical circuits, processors and firmware to eliminate the risk of common design flaws. The preferred embodiments use AND logic such that they both must agree prior to permitting a breaker closure. Additionally, both designs monitor each other such that if they disagree the module prevents the closure of the breaker and informs the user of a potential component failure.

Although the preferred embodiments use diverse design components like different processors, firmware and code, all of the product components could be diverse, including critical and non-critical components to eliminate anomalies with the hardware. Additionally, it is possible to design the separate circuit to provide different design practices. Although the preferred embodiment uses a microprocessor and an FPGA, other types of processors or logic devices could be used as well. Moreover, a different communication method could be used between the two circuits.

The inventions as described herein may have one or more of the following features in addition to any of the features described above. Referring to the figures, the following features are shown.

A system for connecting a first electrical circuit 98 to a second electrical circuit 100, comprising: a breaker 102 disposed between the first electrical circuit 98 and the second electrical circuit 100, the breaker 102 being closed to connect the first and second electrical circuits 98, 100; a first check circuit 10, 14, 18, 30, 32, 66, 74, 90 receiving a first measured electrical property 40, 70 from the first electrical circuit 98 and a second measured electrical property 44, 70 from the second electrical circuit 100; a second check circuit 12, 16, 20, 46, 48, 68, 76, 92 receiving a third measured electrical property 52, 72 from the first electrical circuit 98 and a fourth measured electrical property 56, 72 from the second electrical circuit 100; the first check circuit 10, 14, 18, 30, 32, 66, 74, 90 sets a first authorization 82, 94 to close the breaker 102 if the first and second measured electrical properties 40, 44, 70 are matching; the second check circuit 12, 16, 20, 46, 48, 68, 76, 92 sets a second authorization 84, 96 to close the breaker 102 if the third and fourth electrical properties 52, 56, 72 are matching; and the breaker 102 remains open if the first authorization 82, 94 or the second authorization 84, 96 is not set to close the breaker 102, and the breaker 102 closes if the first authorization 82, 94 and the second authorization 84, 96 are both set to close the breaker 102.

The system wherein the first electrical circuit 98 comprises a power grid.

The system wherein the second electrical circuit 100 comprises an electrical generator.

The system wherein the second electrical circuit 100 further comprises a turbine connected to the electrical generator.

The system wherein the first check circuit 10, 14, 18, 30, 32, 66, 74, 90 comprises a first processor 74 to set the first authorization 82, 94 and the second check circuit 12, 16, 20, 46, 48, 68, 76, 92 comprises a second processor 76 to set the second authorization 84, 96, the first and second processors 74, 76 being different types of processors.

The system wherein the first processor 74 is a microprocessor 74 and the second processor 76 is a field-programmable gate array (FPGA) 76.

The system wherein the first processor 74 is a higher capacity processor than the second processor 76.

The system wherein the first processor 74 also determines changes 80, 86, 88 to be made to the second electrical circuit 100 to match the first and second electrical properties 40, 44, 70, and the second processor 76 does not determine any changes to be made to the second electrical circuit 100.

The system wherein the first processor 74 is programmed with a first programming language and the second processor 76 is programmed with a second programming language, the first and second programming languages being different types of programming languages.

The system wherein the first programming language is C code and the second programming language is VHDL code.

The system further comprising: a first derivation circuit 30 receiving an electrical waveform 34 from the first electrical circuit 98, the first derivation circuit 30 generating the first measured electrical property 38, 40, 70 supplied to the first check circuit 66, 74, 90; a second derivation circuit 32 receiving an electrical waveform 36 from the second electrical circuit 100, the second derivation circuit 32 generating the second measured electrical property 42, 44, 70 supplied to the first check circuit 66, 74, 90; a third derivation circuit 46 receiving the electrical waveform 34 from the first electrical circuit 98, the third derivation circuit 46 generating the third measured electrical property 50, 52, 72 supplied to the second check circuit 68, 76, 92; a fourth derivation circuit 48 receiving the electrical waveform 36 from the second electrical circuit 100, the fourth derivation circuit 48 generating the fourth measured electrical property 54, 56, 72 supplied to the second check circuit 68, 76, 92; wherein the first, second, third and fourth derivation circuits 30, 32, 46, 48 are redundant and matching circuits such that the first and third measured electrical properties 38, 40, 70, 50, 52, 72 are matching and the second and fourth measured electrical properties 42, 44, 70, 54, 56, 72 are matching.

The system further comprising a first A/D (analog to digital) circuit 66 and a second A/D (analog to digital) circuit 68, the first A/D circuit 66 receiving the first and second measured electrical properties 38, 42 and supplying corresponding first and second digital signals 70 to the first processor 74, the second A/D circuit 68 receiving the third and fourth measured electrical properties 50, 54 and supplying corresponding third and fourth digital signals 72 to the second processor 76, wherein the first and second A/D circuits 66, 68 are redundant and matching circuits such that the first and third digital signals 70, 72 are matching and the second and fourth digital signals 70, 72 are matching.

The system wherein the first check circuit 10, 14, 18, 30, 32, 66, 74, 90 outputs a close/open signal 94 to a first relay 104 based on the first authorization 82 and the second check circuit 12, 16, 20, 46, 48, 68, 76, 92 outputs a close/open signal 96 to a second relay 106 based on the second authorization 84, the first and second relays 104, 106 being coupled in series such that the breaker 102 can only close when both the first and second relays 104, 106 are closed.

The system further comprising a human-machine interface (HMI) receiving a third authorization 78 to close the breaker 102 from a human operator, the breaker 102 remaining open if the third authorization 78 is not set to close the breaker 102, and the breaker 102 closes if the first authorization 82, the second authorization 84 and the third authorization 78 are all set to close the breaker 102.

The system wherein the first and third electrical properties 40, 70, 52, 72 each comprise a voltage 70, 72 and a frequency 40, 52 of the first electrical circuit 98, and the second and fourth electrical properties 44, 70, 56, 72 each comprise a voltage 70, 72 and a frequency 44, 56 of the second electrical circuit 100.

The system wherein the first and third electrical properties 40, 70, 52, 72 are the same as each other, and the second and fourth electrical properties 44, 70, 56, 72 are the same as each other.

As shown in FIG. 1, the first circuit 10, 14, 18 may also be provided with other digital inputs 22 as well. For example, digital outputs 24, 26 of the frequency and voltage for the two electrical circuits 98, 100 may be used for additional functions by the first processor 14, 74. A communications bus 28 may also be provided for communicating with other hardware.

It is understood that the preferred embodiments described herein may be implemented as computerized methods in a non-transitory computer readable medium if desired.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A system for connecting a first electrical circuit to a second electrical circuit, comprising:
    a breaker disposed between the first electrical circuit and the second electrical circuit, the breaker being closed to connect the first and second electrical circuits;
    a first check circuit receiving a first measured electrical property from the first electrical circuit and a second measured electrical property from the second electrical circuit;
    a second check circuit receiving a third measured electrical property from the first electrical circuit and a fourth measured electrical property from the second electrical circuit;
    the first check circuit sets a first authorization to close the breaker if the first and second measured electrical properties are matching;
    the second check circuit sets a second authorization to close the breaker if the third and fourth electrical properties are matching; and
    the breaker remains open if the first authorization or the second authorization is not set to close the breaker, and the breaker closes if the first authorization and the second authorization are both set to close the breaker.

2. The system according to claim 1, wherein the first electrical circuit comprises a power grid.

3. The system according to claim 2, wherein the second electrical circuit comprises an electrical generator.

4. The system according to claim 3, wherein the second electrical circuit further comprises a turbine connected to the electrical generator.

5. The system according to claim 1, wherein the first check circuit comprises a first processor to set the first authorization and the second check circuit comprises a second processor to set the second authorization, the first and second processors being different types of processors.

6. The system according to claim 5, wherein the first processor is a microprocessor and the second processor is a field-programmable gate array (FPGA).

7. The system according to claim 5, wherein the first processor is a higher capacity processor than the second processor.

8. The system according to claim 7, wherein the first processor also determines changes to be made to the second electrical circuit to match the first and second electrical properties, and the second processor does not determine any changes to be made to the second electrical circuit.

9. The system according to claim 5, wherein the first processor is programmed with a first programming language and the second processor is programmed with a second programming language, the first and second programming languages being different types of programming languages.

10. The system according to claim 9, wherein the first programming language is C code and the second programming language is VHDL code.

11. The system according to claim 1, further comprising:
a first derivation circuit receiving an electrical waveform from the first electrical circuit, the first derivation circuit generating the first measured electrical property supplied to the first check circuit;
a second derivation circuit receiving an electrical waveform from the second electrical circuit, the second derivation circuit generating the second measured electrical property supplied to the first check circuit;
a third derivation circuit receiving the electrical waveform from the first electrical circuit, the third derivation circuit generating the third measured electrical property supplied to the second check circuit;
a fourth derivation circuit receiving the electrical waveform from the second electrical circuit, the fourth derivation circuit generating the fourth measured electrical property supplied to the second check circuit;
wherein the first, second, third and fourth derivation circuits are redundant and matching circuits such that the first and third measured electrical properties are matching and the second and fourth measured electrical properties are matching.

12. The system according to claim 1, further comprising a first A/D (analog to digital) circuit and a second A/D (analog to digital) circuit, the first A/D circuit receiving the first and second measured electrical properties and supplying corresponding first and second digital signals to the first processor, the second A/D circuit receiving the third and fourth measured electrical properties and supplying corresponding third and fourth digital signals to the second processor, wherein the first and second A/D circuits are redundant and matching circuits such that the first and third digital signals are matching and the second and fourth digital signals are matching.

13. The system according to claim 1, wherein the first check circuit outputs a close/open signal to a first relay based on the first authorization and the second check circuit outputs a close/open signal to a second relay based on the second authorization, the first and second relays being coupled in series such that the breaker can only close when both the first and second relays are closed.

14. The system according to claim 1, further comprising a human-machine interface (HMI) receiving a third authorization to close the breaker from a human operator, the breaker remaining open if the third authorization is not set to close the breaker, and the breaker closes if the first authorization, the second authorization and the third authorization are all set to close the breaker.

15. The system according to claim 1, wherein the first and third electrical properties each comprise a voltage and a frequency of the first electrical circuit, and the second and fourth electrical properties each comprise a voltage and a frequency of the second electrical circuit.

16. The system according to claim 1, wherein the first and third electrical properties are the same as each other, and the second and fourth electrical properties are the same as each other.

17. The system according to claim 1, wherein the first and third electrical properties each comprise a voltage and a frequency of the first electrical circuit, and the second and fourth electrical properties each comprise a voltage and a frequency of the second electrical circuit, the first and third electrical properties are the same as each other, and the second and fourth electrical properties are the same as each other, the first electrical circuit comprises a power grid, and the second electrical circuit comprises an electrical generator.

18. The system according to claim 17, wherein the first check circuit comprises a first processor to set the first authorization and the second check circuit comprises a second processor to set the second authorization, the first and second processors being different types of processors, the first processor is a higher capacity processor than the second processor, and the first processor is programmed with a first programming language and the second processor is programmed with a second programming language, the first and second programming languages being different types of programming languages.

19. The system according to claim 18, further comprising:
a first derivation circuit receiving an electrical waveform from the first electrical circuit, the first derivation circuit generating the first measured electrical property supplied to the first check circuit;
a second derivation circuit receiving an electrical waveform from the second electrical circuit, the second derivation circuit generating the second measured electrical property supplied to the first check circuit;
a third derivation circuit receiving the electrical waveform from the first electrical circuit, the third derivation circuit generating the third measured electrical property supplied to the second check circuit;
a fourth derivation circuit receiving the electrical waveform from the second electrical circuit, the fourth derivation circuit generating the fourth measured electrical property supplied to the second check circuit;
wherein the first, second, third and fourth derivation circuits are redundant and matching circuits such that the first and third measured electrical properties are matching and the second and fourth measured electrical properties are matching; and
further comprising a first A/D (analog to digital) circuit and a second A/D (analog to digital) circuit, the first A/D circuit receiving the first and second measured electrical properties and supplying corresponding first and second digital signals to the first processor, the second A/D circuit receiving the third and fourth measured electrical properties and supplying corresponding third and fourth digital signals to the second processor, wherein the first and second A/D circuits are redundant and matching circuits such that the first and third digital signals are matching and the second and fourth digital signals are matching.

20. The system according to claim 19, further comprising a human-machine interface (HMI) receiving a third authorization to close the breaker from a human operator, the breaker remaining open if the third authorization is not set to close the breaker, and the breaker closes if the first authorization, the second authorization and the third authorization are all set to close the breaker, the first processor is a microprocessor and the second processor is a field-programmable gate array (FPGA), the first processor also determines changes to be made to the second electrical circuit to match the first and second electrical properties, and the second processor does not determine any changes to be made to the second electrical circuit, the first programming language is C code and the second programming language is VHDL code, and the first check circuit outputs a close/open signal to a first relay based on the first authorization and the second check circuit outputs a close/open signal to a second relay based on the second authorization, the first and second relays being coupled in series such that the breaker can only close when both the first and second relays are closed.

* * * * *